United States Patent
Donoghue et al.

(10) Patent No.: US 11,035,033 B2
(45) Date of Patent: Jun. 15, 2021

(54) DIRECT-DEPOSITION SYSTEM INCLUDING STANDOFFS FOR CONTROLLING SUBSTRATE-MASK SEPARATION

(71) Applicant: eMagin Corporation, Hopewell Junction, NY (US)

(72) Inventors: Evan P. Donoghue, Hopewell Junction, NY (US); Fridrich Vazan, Pittsford, NY (US); Kerry Tice, Hopewell Junction, NY (US); Ilyas I. Khayrullin, Hopewell Junction, NY (US); Tariq Ali, Hopewell Junction, NY (US); Qi Wang, Hopewell Junction, NY (US); Laurie Sziklas, Hopewell Junction, NY (US); Amalkumar P. Ghosh, Hopewell Junction, NY (US)

(73) Assignee: eMagin Corporation, Hopewell Junction, NY (US)

(*) Notice: Subject to any disclaimer, the term of this patent is extended or adjusted under 35 U.S.C. 154(b) by 120 days.

(21) Appl. No.: 16/169,678

(22) Filed: Oct. 24, 2018

(65) Prior Publication Data

US 2020/0131617 A1 Apr. 30, 2020

Related U.S. Application Data

(60) Provisional application No. 62/576,211, filed on Oct. 24, 2017.

(51) Int. Cl.
*C23C 14/04* (2006.01)
*H01L 51/56* (2006.01)
*C23C 14/54* (2006.01)
*H01L 51/00* (2006.01)

(52) U.S. Cl.
CPC .......... *C23C 14/042* (2013.01); *C23C 14/048* (2013.01); *C23C 14/542* (2013.01); *H01L 51/0011* (2013.01); *H01L 51/56* (2013.01)

(58) Field of Classification Search
CPC .................................................... C23C 14/042
See application file for complete search history.

(56) References Cited

U.S. PATENT DOCUMENTS

| | | | | |
|---|---|---|---|---|
| 4,273,812 A | * | 6/1981 | Tsutsui | C23C 14/042 118/504 |
| 6,878,209 B2 | * | 4/2005 | Himeshima | H01L 27/3283 118/504 |
| 2004/0142108 A1 | * | 7/2004 | Atobe | C23C 14/24 427/282 |
| 2015/0041793 A1 | * | 2/2015 | Chan | H01L 51/56 257/40 |

FOREIGN PATENT DOCUMENTS

JP 3794407 B2 * 7/2006 ........... C23C 14/042

* cited by examiner

*Primary Examiner* — Keath T Chen
(74) *Attorney, Agent, or Firm* — Kaplan Breyer Schwarz, LLP (57) ABSTRACT

The present disclosure enables high-resolution direct patterning of a material on a substrate by establishing and maintaining a separation between a shadow mask and a substrate based on the thickness of a plurality of standoffs. The standoffs function as a physical reference that, when in contact between the substrate and shadow mask determine the separation between them. Embodiments are described in which the standoffs are affixed to an element selected from the shadow mask, the substrate, the mask chuck, and the substrate chuck.

16 Claims, 10 Drawing Sheets

FIG. 5C — Sectional View Through line a-a

FIG. 5D — Sectional View Through line a-a

DIRECT-DEPOSITION SYSTEM INCLUDING STANDOFFS FOR CONTROLLING SUBSTRATE-MASK SEPARATION

STATEMENT OF RELATED CASES

This case claims the benefit of U.S. Provisional Patent Application Ser. No. 62/576,211 filed on Oct. 24, 2017, entitled "Standoffs to Establish and Maintain a Gap Between Substrate and Shadow Mask During the Fabrication of Directly Patterned OLED Microdisplays", which is incorporated herein by reference.

If there are any contradictions or inconsistencies in language between this application and the case that has been incorporated by reference that might affect the interpretation of the claims in this case, the claims in this case should be interpreted to be consistent with the language in this case.

TECHNICAL FIELD

The present disclosure relates to thin-film deposition in general, and, more particularly, evaporation-based direct deposition of patterned thin films via shadow masks.

BACKGROUND

Semiconductor device fabrication requires the formation of one or more patterned layers of material on the surface of a substrate. The most common approach for forming a patterned layer of material includes depositing the material over the entire surface of the substrate (i.e., forming a full-surface layer) and subsequently remove material everywhere except where it is desired—commonly referred to as "subtractive patterning."

The unwanted material is normally removed in a multi-step process in which a layer of photoresist is formed over the material layer and illuminated with a pattern of light that is based on the desired material pattern. After it has been exposed, the photoresist covering the material to be removed is dissolved in a strongly basic developer solution, which leaves behind a photoresist mask that covers only the material to remain on the substrate. The exposed material is then removed using an etchant (liquid or gaseous), realizing the desired material pattern. Once the material layer has been patterned, the photoresist mask must be removed and the substrate thoroughly cleaned to ensure no photoresist residue or etch product remains on any of its surfaces.

During the subtractive patterning process, everything on the substrate (e.g., the substrate itself, any previously defined structures and materials, etc.) is exposed to harsh chemicals, including the photoresist developer solution, the etchant used to pattern the material layer, and the chemicals used to clean the substrate. Unfortunately, many materials, such as organic and biological materials, cannot survive exposure to one or more of these chemicals. As a result, subtractive patterning cannot be used with such "sensitive materials" or to pattern any material layer formed subsequent to deposition of a sensitive material on a substrate. For such operations, therefore, a direct patterning process must be used.

A direct-patterning process forms a desired pattern of material while the material is being deposited, thereby avoiding the need for post-deposition treatments and the harsh chemicals they normally involve. One such direct-patterning process is shadow-mask deposition, which is analogous to stencil-based printing techniques, such as stencil painting, silk screen printing, and the like.

A shadow mask used in semiconductor fabrication normally includes a thin layer of structural material having a pattern of apertures (i.e., openings) that matches the pattern desired for the deposited material. During shadow-mask deposition, vapor molecules of the material are generated such that they flow from a source toward the substrate surface. The vapor molecules can be generated via any of a variety of processes, such as thermal evaporation, sputtering, and the like. The substrate and shadow mask are individually held in separate chucks and aligned relative to each other using an alignment system such that the shadow mask is positioned just in front of the substrate surface. When the flow of material reaches the shadow mask, the passage of material to the substrate is blocked everywhere except at the apertures. As a result, the material layer is directly patterned during its deposition on the substrate and no additional post-deposition processing is required.

Historically, shadow-mask deposition has been used in semiconductor fabrication to define patterns of relatively large (>50 micron) features, such as wire-bond pads, etc. A typical shadow mask used in such applications is a thin, patterned metal layer held in an annular frame. While the minimum feature size and minimum separation between apertures for such shadow masks is quite large (typically greater than several tens of microns), such shadow masks are perfectly suitable for defining large-feature-size, sparse patterns of material like wire-bond pad patterns.

More recently, it has become desirable to employ shadow-mask deposition in the formation of electronic devices based on chemically sensitive organic materials, such as organic light-emitting diodes (OLED), active-matrix OLED displays, organic solar cells, biological-material-based sensors, and the like. In many cases, much higher resolution and much greater pattern density are required than can be achieved with a conventional metal-layer-based shadow masks. As a result, high-performance shadow masks have been developed based on very thin dielectric and/or semiconductor layers that enable feature sizes and pattern densities that are less than or equal to ten microns.

A high-performance shadow mask typically has a very thin (<1 micron) layer of structural material (e.g., silicon nitride, silicon, etc.) disposed on an annular frame formed from a semiconductor or glass handle substrate. The apertures are formed in the thin structural layer, after which the center portion of the handle substrate is removed to leave the central region of the structural layer as a patterned edge-supported membrane.

Theoretically, during shadow-mask deposition, material deposits only on the surface of the substrate in those regions located directly behind the apertures. In practice, however, as the material vapor travels from the source to the shadow mask, many vapor molecules propagate along directions that are not perfectly normal to the shadow mask and substrate. As a result, some molecules continue to travel laterally after passing through the shadow mask such that the resultant patterned regions extend beyond the edges of the apertures. The magnitude of this lateral spreading of the features (referred to as "feathering") is a function of the separation distance between the substrate surface and the shadow mask.

While feathering is not usually a critical issue when forming large, widely spaced features (e.g., wire-bond pads, etc.), it can be catastrophic when forming small-feature, highly dense patterns like those required in OLED display manufacture. For example, feathering can result in electrical shorts between adjacent electrical components, color mixing between different pixels or sub-pixels in an OLED display, and the like. In fact, feathering has been a limiting factor for the minimum feature size and pattern density attainable using shadow-mask deposition.

To limit feathering in a high-density deposition, the mask and substrate are held in very close proximity (from approximately 0-20 microns. The need for such close proximity prevents the use of most conventional substrate chucks or clamping mechanisms, which typically use a mechanical force applied to the front of the wafer. As a result, electrostatic chucks have been developed for holding shadow masks and/or substrates via application of a large voltage through a dielectric across their back surface. This mitigates the need for mechanical structures between the shadow mask and substrate, thereby enabling them to be held in close proximity.

Unfortunately, the electrostatic clamping force of an electrostatic chuck can induce image charges to form on the surface of the shadow mask and/or substrate, particularly when a large voltage is used. As a result, when the shadow mask and substrate are in extremely close proximity, these induced charges can create a powerful attractive force between the mask and substrate causing them to move into physical contact and stick together. The motion of one or both of the shadow mask and substrate can misalign the apertures and the regions of the substrate surface on which deposition is desired (i.e., the deposition sites), cause damage to one or both of the shadow mask and substrate, and/or result in irreversible adhesion between the shadow mask and substrate.

It should be noted that, even without the use of an electrostatic chuck, physical contact between the surfaces of a shadow mask and substrate can result in their becoming permanently stuck together if the contact area between them is sufficiently large, clean, and flat. Furthermore, stray particles trapped between the shadow mask and substrate can cause a relative tilt between them, resulting in a variation in the separation between the two objects across their surfaces that exacerbates feathering issues. Still further, system drifts caused by heating during the deposition process, environmental factors (e.g., shock, vibration, etc.), and the like, can make it extremely challenging to establish a very small separation between the shadow mask and substrate and maintain the separation throughout the course of a deposition.

The need for a practical direct-deposition approach suitable for defining high-resolution material layers in which a very small, controlled, uniform separation between a shadow mask and a substrate is established and maintained remains, as yet, unmet in the prior art.

SUMMARY

The present disclosure presents apparatus and methods that enable direct patterning of an organic-material layer via evaporation through a shadow mask onto a target substrate without some of the costs and disadvantages of the prior art. Embodiments in accordance with the present disclosure facilitate the formation of patterns of material on a target substrate, such as thin- and thick-film layers in packaging applications, integrated-circuit processing applications, and the like. Embodiments in accordance with the present disclosure are particularly well suited for use for forming high-density, high-resolution patterns of sensitive materials, such as organic light-emitting material suitable for use in pixels and sub-pixels of high-resolution organic light-emitting diode-based displays, among other applications.

Like the prior art, a deposition system in accordance with the present disclosure directly deposits a pattern of material on a substrate surface by flowing vaporized material through a shadow mask located between the material source and the substrate surface.

In contrast to the prior art, a deposition system in accordance with the present disclosure includes a plurality of standoffs that help establish and maintain a desired small separation between the shadow mask and substrate during deposition. The use of the standoffs affords such embodiments several important advantages, including: better control over substrate/shadow-mask separation, better control over the shape of the deposited features, and a reduced contact area with one or both of the shadow mask and substrate, thereby mitigating irreversibly stiction between the shadow mask and substrate.

An illustrative embodiment is a deposition system that includes a mask chuck for holding a shadow mask, the shadow mask, a substrate chuck for holding a target substrate, and an alignment system for controlling the positions of the mask chuck and substrate chucks to align the shadow mask to the substrate. The shadow mask includes a plurality of apertures that is arranged in an aperture pattern and a plurality of standoffs affixed to its outer surface (i.e., the surface facing the substrate during deposition), where each standoff has a thickness equal to the desired separation between the shadow mask and substrate during deposition. During alignment of the shadow mask and substrate, the alignment system brings the standoffs into contact with the substrate. As a result, the height of the standoffs dictates the separation between the shadow mask and substrate.

In the illustrative embodiment, the aperture pattern includes a plurality of fields that are separated by aperture-free lanes. The standoffs are distributed across the surface of the shadow mask such that some of the standoffs are located outside the lateral extent of the aperture pattern and one of the standoffs is centered in each lane. As a result, the separation between the shadow mask and substrate is substantially uniform across the lateral extent of the feature pattern. In some embodiments, more than one standoff is located in each lane. In some embodiments, one or more of the lanes does not include a standoff. In some embodiments, the standoffs are located only outside the lateral extent of the aperture pattern.

In some embodiments, the standoffs are provided such that they are affixed to the top surface of the substrate (i.e., the surface on which material deposition occurs). In some of these embodiments, the substrate includes a plurality of deposition sites that is arranged in a feature pattern comprising a plurality of die regions separated by deposition-site-free streets, where each die region includes at least one deposition site. The standoffs are distributed across the surface of the substrate such that each street includes at least one of the standoffs, thereby facilitating uniform separation between the shadow mask and substrate. In some embodiments one standoff is centered in each street.

In some embodiments, the standoffs are provided such that they are affixed to one or both of the mask chuck and substrate chuck. In some embodiments, the standoffs are provided such that they are affixed to two or more of the shadow mask, substrate, mask chuck, and substrate chuck. In some embodiments, the standoffs are provide as part of a frame that is independent of (i.e., not affixed to) any of the shadow mask, substrate, mask chuck, and substrate chuck. In operation the frame is inserted between the shadow mask and substrate, or between the mask chuck and substrate chuck, prior to alignment of the shadow mask and substrate.

An embodiment in accordance with the present disclosure is a direct-deposition system for forming a patterned layer of a first material on a substrate by depositing the first material onto the substrate through a shadow mask, wherein the system comprises: a first chuck for holding the substrate; a second chuck for holding the shadow mask; and a plurality of standoffs that are configured to establish a first separation between the shadow mask and the substrate.

Another embodiment in accordance with the present disclosure is a direct-deposition system for forming a patterned layer of a first material on a substrate by depositing the first material onto the substrate through a shadow mask, wherein the system comprises: a first chuck for holding the substrate; a second chuck for holding the shadow mask; a plurality of standoffs that is configured to establish a first separation between the shadow mask and the substrate; and an alignment system configured to establish a second separation between the shadow mask and substrate, the second separation being based on the first separation.

Yet another embodiment in accordance with the present disclosure is a method for forming a patterned layer of a first material on a substrate by depositing the first material onto the substrate through a shadow mask, wherein the method comprises: providing the substrate such that it includes a first surface that defines a first plane; providing the shadow mask such that it includes a plurality of apertures that extend through the shadow mask from a second surface that defines a second plane; providing a plurality of standoffs having a first height; mounting the substrate in a first chuck; mounting the substrate in a second chuck; and establishing a first separation between the first plane and second plane based on the first height, wherein the first separation is established such that the first plane and second plane are substantially parallel.

DETAILED DESCRIPTION

The following terms are defined for use in this Specification, including the appended claims:

direct deposition is defined as a material-deposition process that realizes a patterned layer on a substrate during the deposition process itself and without the need for post-deposition patterning operations, such as photolithography, etching, and the like. Examples of direct-deposition processes include, without limitation, evaporation or sputtering of a material onto a substrate through a shadow mask, silk screening, stencil painting, and the like.

affixed is defined as a physical relationship between at least two elements in which they are permanently joined together such that they cannot be taken out of physical contact without damage to either element. For example, a standoff that is formed on a shadow mask by a process such as evaporation, sputtering, electroplating, and the like, is affixed to the shadow mask.

unaffixed is defined as a physical relationship between at least two elements in which they are not permanently joined together such that they can be taken out of physical contact without damage to either element. For example, a standoff that simply placed in physical contact with a shadow mask without joining the two elements is unaffixed to the shadow mask.

abutting relationship is defined as a physical relationship between at least two elements in which they are in physical contact but not affixed such that they can be taken out of physical contact without damage to either element. Two elements that are in an abutting relationship are unaffixed. For example, a coffee cup set on the surface of a desktop is in an abutting relationship with the desktop, while a coffee cup fastened to the desktop by epoxy is affixed to the desktop rather than in an abutting relationship with the desktop.

Figure 1:
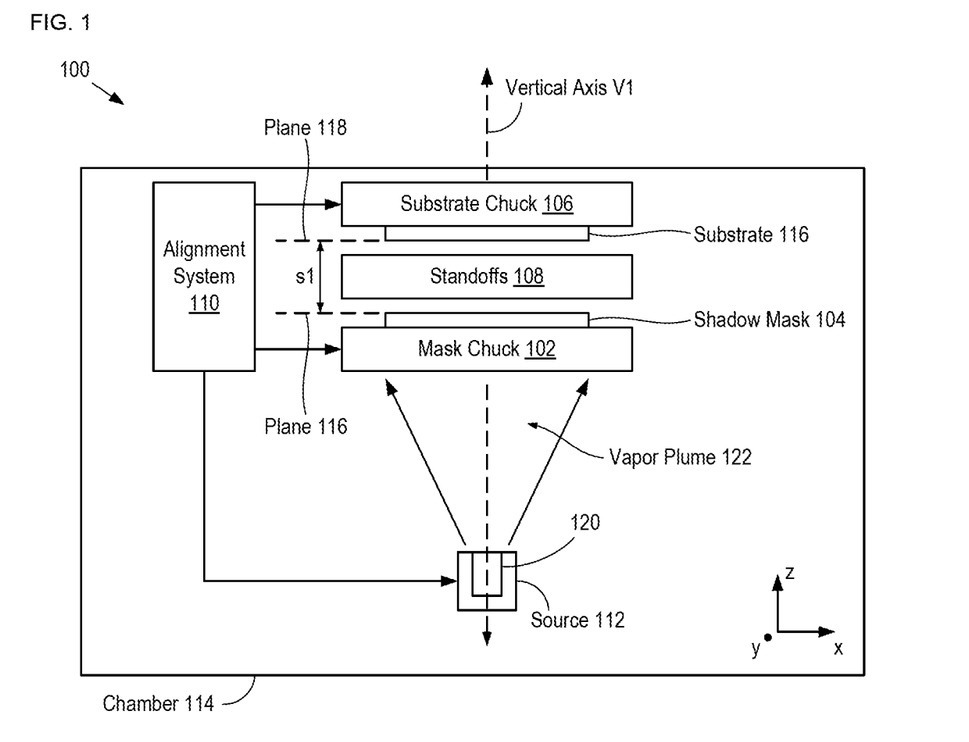
FIG. 1 depicts a block diagram of an illustrative embodiment of a direct-deposition system in accordance with the present disclosure.

FIG. 1 depicts a block diagram of an illustrative embodiment of a direct-deposition system in accordance with the present disclosure. System 100 includes mask chuck 102, shadow mask 104, substrate chuck 106, standoffs 108, alignment system 110, source 112, and vacuum chamber 114.

Mask chuck 102 is an annular fixture that holds shadow mask 104 via an attractive force imparted on only its back surface while enabling the passage of vaporized material 120 to pass through the apertures of the shadow mask. In the depicted example, mask chuck 102 holds shadow mask 104 using electrostatic force. In some embodiments, mask chuck 102 holds a shadow mask via a different attractive force, such as a vacuum-generated force, a magnetic force, etc. Some examples of mask chucks suitable use in accordance with the present disclosure are described in U.S. patent application Ser. No. 15/602,939 filed Mar. 8, 2018 entitled "Shadow-Mask-Deposition System and Method Therefor," which is incorporated herein by reference.

Shadow mask 104 is a high-precision shadow mask comprising a handle substrate and a thin membrane suspended over a central opening formed in the handle substrate. The membrane includes a pattern of apertures (i.e., through-holes) that is arranged based on the desired material pattern to be deposited on substrate 116. It should be noted that, while shadow mask 104 is a high-precision, membrane-based shadow mask, virtually any type of shadow mask can be used in accordance with the present invention.

Substrate chuck 106 is a conventional vacuum chuck that holds substrate 116 against a flat platen via a vacuum force. In some embodiments, substrate chuck 106 holds substrate 116 against its platen via a different attractive force, such as an electrostatic force, a magnetic force, etc. For the purposes of this Specification, including the appended claims, the term "magnetic force" is defined such that it encompasses any force arising from the use of permanent magnets and/or electromagnets.

Preferably, mask chuck 102 and substrate chuck 106 apply attractive forces to only the back surfaces shadow mask 104 and substrate 116, respectively, to avoid the need for any physical structure that projects between plane 118 (defined by the front surface of shadow mask 104) and plane 120 (defined by the front surface of substrate 116).

Standoffs 108 include a plurality of features configured to facilitate the establishment and maintenance of a desired separation, s1, between planes 118 and 120 during deposition of material on substrate 116. Preferably, standoffs 108 are dimensioned and arranged such that s1 is substantially uniform across the lateral extent of the pattern of apertures included in shadow mask 104. As discussed below, in accordance with the present disclosure, standoffs 108 can be affixed to one or more of a group of elements including mask chuck 102, shadow mask 104, substrate chuck 106, and substrate 116; however, each of standoffs 108 is affixed to only one of these elements. In other words, in some embodiments, only one of the elements (e.g., shadow mask 104) has standoffs 108 affixed to it, while in some embodiments, different standoffs are affixed to different elements of the group (e.g., shadow mask 104 and substrate 116) such that more than one element of the group has at least one standoff affixed to it.

Alignment system 110 is a high-precision alignment system for controlling the relative position between substrate 116 and shadow mask 104. In the depicted example, alignment system 110 is capable of independently controlling the position of each of substrate chuck 102 and mask chuck 104 in six dimensions. Alignment system 110 is also capable of controlling the position of source 112 so that it can be moved relative to the substrate/shadow mask combination to improve deposition uniformity across the substrate, if desired.

Source 112 is a source for providing material 120 in a manner that enables its deposition on substrate 116 through the aperture pattern of shadow mask 104. In the depicted example, source 112 is a conventional evaporation source configured to melt and/or sublime material 120 and produce vapor plume 122 from a single evaporation nozzle, such that the vapor plume is substantially centered on vertical axis V1. In the depicted example, material 120 is organic light-emitting material suitable for use in an organic light-emitting diode (OLED) included in a pixel or sub-pixel of an OLED-based display. In some embodiments, source 112 is a different source suitable for depositing material 120 on substrate 116. Alternative sources suitable for use in accordance with the present disclosure include, without limitation, two-dimensional planar sources comprising planar metal sheets that function as heaters for evaporating/subliming material 120, evaporation sources comprising linear or two-dimensional arrangements of evaporation nozzles, e-beam evaporation sources, sputter-deposition sources, and the like.

Furthermore, while the depicted example is a system for direct-deposition of light-emitting organic material, it should be noted that the teachings of the present disclosure are suitable for deposition of a wide variety of materials (e.g., organic materials, inorganic materials, etc.).

Vacuum chamber 114 is a conventional pressure vessel for containing a low-pressure environment required for the evaporation of material 120. Vacuum chamber 114 encloses mask chuck 102, shadow mask 104, substrate chuck 106, standoffs 108, source 112, and substrate 116. In the depicted example, vacuum chamber 114 a standalone unit; however, as will be appreciated by one skilled in the art, vacuum chamber 114 can be part of a cluster-deposition system, track-deposition system, and the like, without departing from the scope of the present invention.

Figure 2:
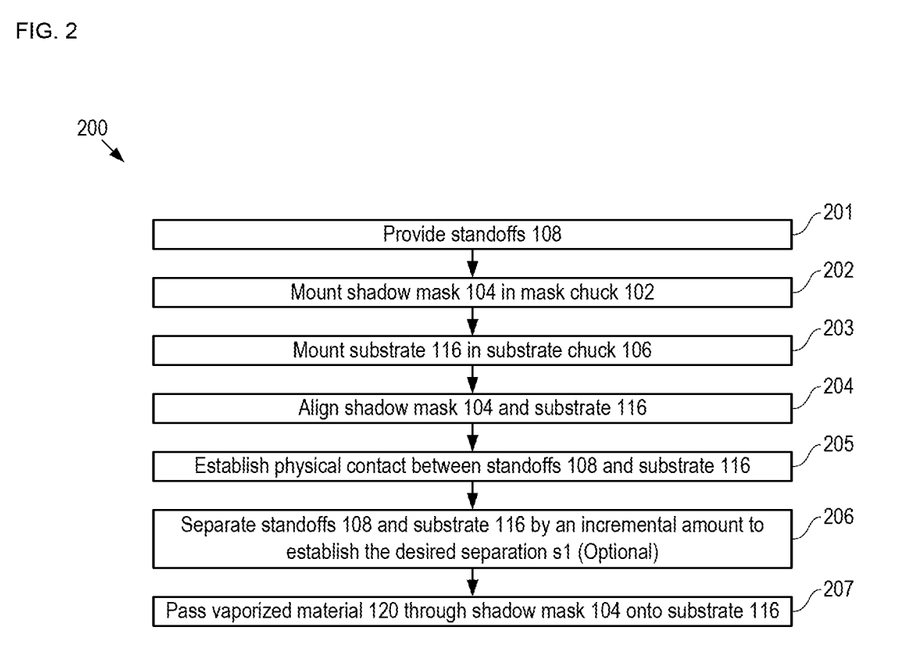
FIG. 2 depicts operations of a method suitable for forming a patterned layer of material on a substrate in accordance with the illustrative embodiment.

FIG. 2 depicts operations of a method suitable for forming a patterned layer of material on a substrate in accordance with the illustrative embodiment. Method 200 begins with operation 201, wherein standoffs 108 are provided. Method 200 is described with continuing reference to FIG. 1, as well as reference to FIGS. 3-6.

In the depicted example, standoffs 108 are provided such that they are disposed on and affixed to shadow mask 104. It should be noted, however, that in some embodiments, standoffs 108 are provided on one of mask chuck 102, substrate chuck 106, and substrate 116. Furthermore, although in the depicted example, standoffs are affixed only to one of the group of elements including mask chuck 102, shadow mask 104, substrate chuck 106, and substrate 116, in some embodiments more than one of these elements has at least one standoff affixed to it. Note, however, even when more than one of the elements has a standoff affixed to it, no single standoff is affixed to more than one element of the group.

Figure 3A:
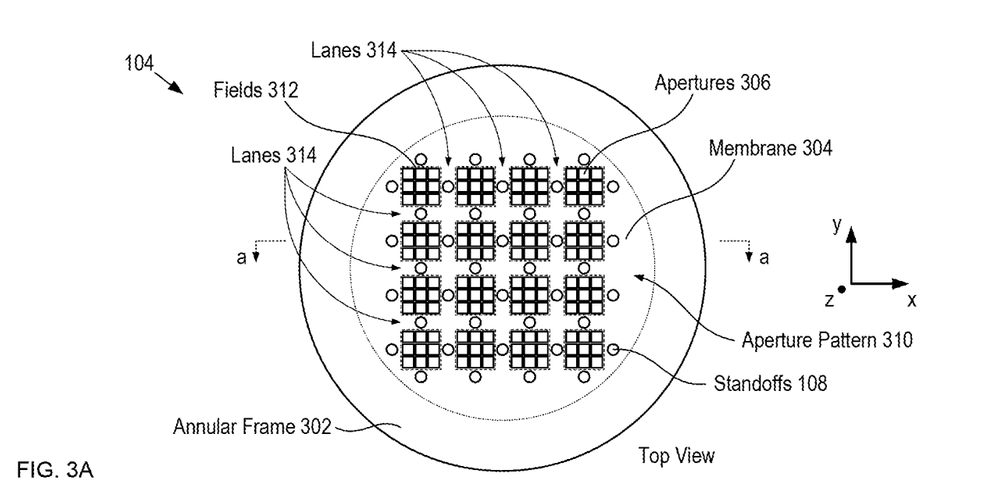
FIGS. 3A-B depicts schematic drawings of top and sectional views, respectively, of shadow mask 104.
Figure 3B:
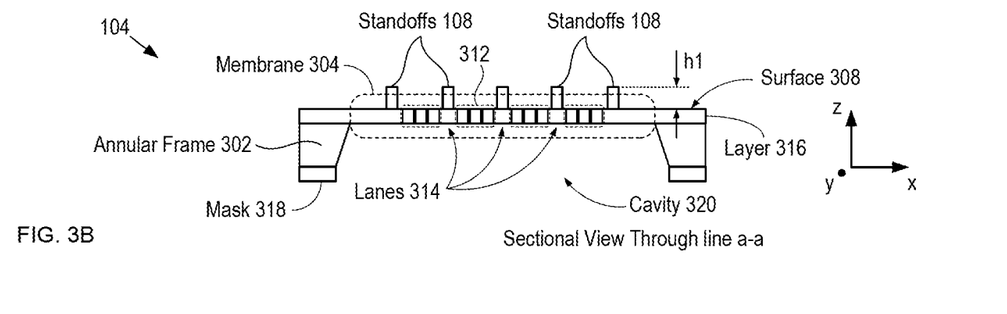

FIGS. 3A-B depicts schematic drawings of top and sectional views, respectively, of shadow mask 104. The sectional view depicted in FIG. 3B is taken through line a-a shown in FIG. 3A.

Shadow mask 104 is a high-precision shadow mask that includes annular frame 302, membrane 304, apertures 306, and standoffs 108.

Annular frame 302 is an annulus of structural material having a central opening (i.e., cavity 320) that is larger than the lateral extent of the pattern of apertures 306 (i.e., aperture pattern 310).

Membrane 304 is a thin layer of structural material suspended from annular frame 302 to define a membrane region that includes apertures 306.

Apertures 306 are through-holes formed through the thickness of membrane 304, through which material 120 can pass during its deposition on substrate 116. In the depicted example, apertures 306 are substantially square holes having sides of approximately 10 microns and are arranged in aperture pattern 310, which includes a 4×4 array of fields 312, which are separated from one another by lanes 314. Each field 312 includes a 3×3 array of apertures 306, while each lane 314 is aperture free. It should be noted that aperture pattern 310 can include any number and arrangement of fields 312, and each field 312 can include any number and arrangement of apertures 306. In some embodiments, at least one of fields 312 includes a different number and/or arrangement of apertures than at least one other field 312. In some embodiments, at least one of apertures 306 has a size and/or shape other than a 10 micron square.

Standoffs 108 are structural features formed on surface 308 of structural layer 316. In the depicted example, each of standoffs 108 is a substantially circular pillar having a height of approximately 10 microns and a diameter of approximately 20 microns. It should be noted that standoffs 108 can have any practical height, diameter, and/or shape; however, h1 is preferably within the range of approximately 0.1 micron to approximately 20 microns. Furthermore, keeping the cross-sectional area of standoffs 108 small mitigates the development of irreversible stiction between the standoffs and any surface with which they are brought into physical contact.

In the depicted example, standoffs are distributed on surface 308 such that they reside outside aperture pattern 310 and a standoff is located between each pair of adjacent fields 312 in both the x- and y-directions. As will be appreciated by one skilled in the art, after reading this Specification, the locations and arrangements of standoffs 108 are matters of design choice and depend on several factors, such as the size of fields 312, the desired separation, s1, between shadow mask 104 and substrate 116, and the like. For example, in some embodiments, standoffs 108 are located only outside of the lateral extent of aperture pattern 310, while in other embodiments, standoffs 108 are located only within the lateral extent of aperture pattern 310.

Figure 4:
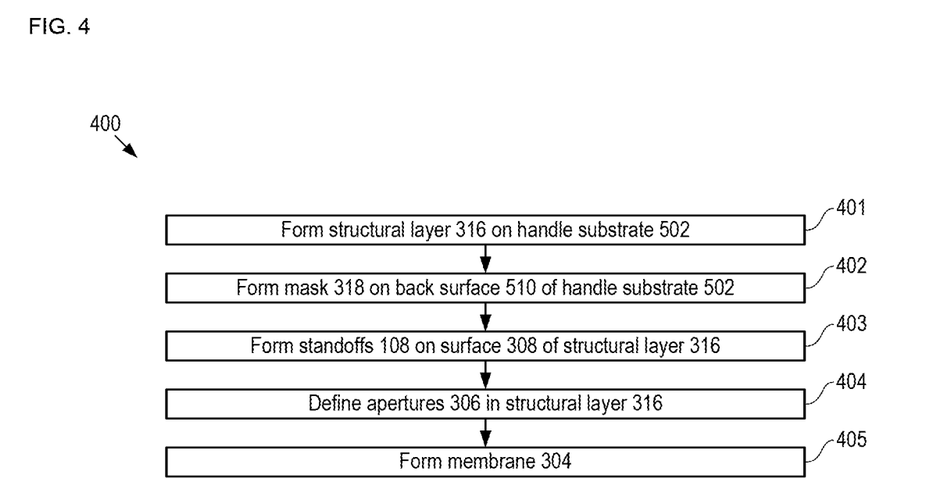
FIG. 4 depicts operations of a method suitable for forming shadow mask 104 in accordance with the illustrative embodiment.

FIG. 4 depicts operations of a method suitable for forming shadow mask 104 in accordance with the illustrative embodiment. Method 400 is described with continuing reference to FIGS. 3A-B, as well as reference to FIGS. 5A-D.

FIGS. 5A-D depict sectional views of shadow mask 104, taken through line a-a, at different points in its fabrication.

Figure 5A:
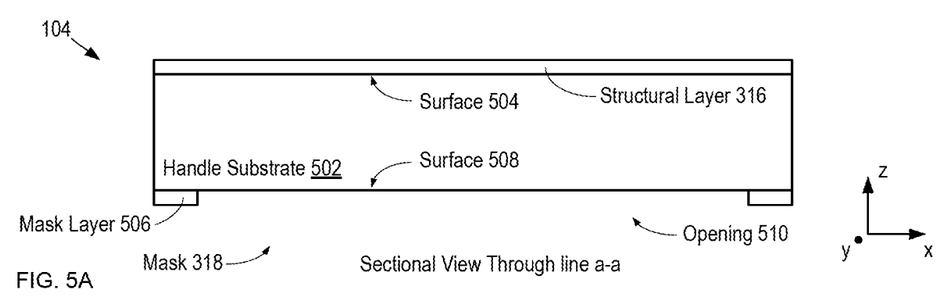
FIGS. 5A-D depict sectional views of shadow mask 104, taken through line a-a, at different points in its fabrication.

Method 400 begins with operation 401, wherein structural layer 316 is formed on surface 506 of handle substrate 502.

Handle substrate 502 is a conventional, circular single-crystal silicon wafer suitable for planar processing; however, it will be apparent to one skilled in the art that a variety of materials and/or shapes (e.g., circular, square, rectangular, irregular, etc.) can be used for handle substrate 502 without departing from the scope of the present disclosure. Materials suitable for use in handle substrate 502 include, without limitation, semiconductors, glasses, ceramics, composite materials, metals, plastics, and the like.

Structural layer 316 is a one-micron-thick layer of silicon nitride having an increased silicon content (i.e., silicon-rich silicon nitride). The silicon content is chosen to reduce the magnitude of its residual tensile stress to approximately 300 MPa from the residual tensile stress of approximately 1 GPa for stoichiometric silicon nitride (i.e., $Si_3N_4$). It should be noted that, while a tensile stress is desirable, the given magnitude of residual stress for structural layer 316 is merely exemplary and that the stress of the structural layer can vary over a wide range without departing from the scope of the present disclosure. Furthermore, in some embodiments, structural layer 316 comprises a material other than silicon-rich silicon nitride, such as silicon (e.g., single-crystal silicon, polysilicon, amorphous silicon, etc.), silicon oxynitride, silicon oxides, aluminum oxide, composite layers that include a plurality of material layers of one or more materials (e.g., silicon and silicon nitride, silicon oxide and silicon nitride, etc.), compound semiconductors, ceramics, metals, and the like.

At operation 402, mask 318 is formed on back surface 510 of handle substrate 502 by forming mask layer 508 and patterning it to define opening 510. In the depicted example, mask layer 508 is a layer of stoichiometric silicon nitride having a thickness of approximately 200 nm. In some embodiments, mask layer 508 includes a different material suitable for use as a masking layer in a crystallographic etch process, such as silicon dioxide, etc.

FIG. 5A depicts a sectional view of nascent shadow mask 104 after mask 318 has been defined.

Figure 5B:
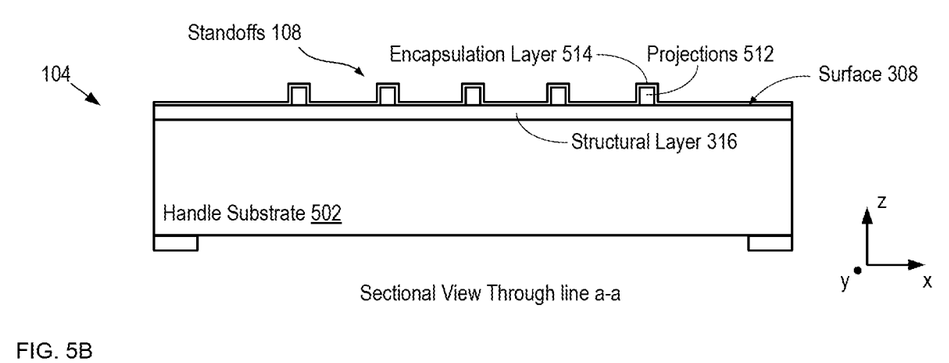

At operation 403, standoffs 108 are formed on surface 308 of structural layer 316.

In the depicted example, standoffs 108 are formed in a two-step process that begins with the formation a plurality of projections 514.

Projections 514 are islands of silicon dioxide that is formed in conventional fashion via vapor deposition, spin-coating, etc., and patterned via conventional lithography and etching. It should be noted that projections 514 can be formed using any of a variety of materials, including dielectrics, semiconductors, metals, and the like.

After the formation of projections 514, encapsulation layer 516 is conformally deposited, which completely encases the projections between structural layer 316 and encapsulation layer 516. In the depicted example, encapsulation layer 516 is a thin (e.g., 50 nm) layer of stoichiometric silicon nitride having a residual tensile stress of approximately 1 GPa. The use of stoichiometric silicon nitride for encapsulation layer 516 has two significant advantages. First, it provides a high degree of protection for projections 514 during subsequent processing. Second, it gives rise to a stress gradient through the thickness of the combined structural/encapsulation layers, which results in a mechanical prebias that can offset at least some of the effect of gravity on membrane 304 during operation. The benefits of providing a mechanical prebias to a shadow-mask membrane are discussed in detail in U.S. patent application Ser. No. 15/968,443, filed May 1, 2018, which is incorporated herein by reference.

FIG. 5B depicts a sectional view of nascent shadow mask 104 after the formation of standoffs 108.

It should be noted that the method for forming standoffs 108 described above is merely exemplary and that many alternative standoff structures and standoff-fabrication methods are within the scope of the present disclosure. For example, in some embodiments, standoffs 108 are formed by depositing one or more layers of suitable structural material on structural layer 316 and patterning the structural material to define the standoffs. In some embodiments, standoffs 108 are formed after definition of membrane 304 using a direct-patterning process such as evaporation through a shadow mask.

Figure 5C:
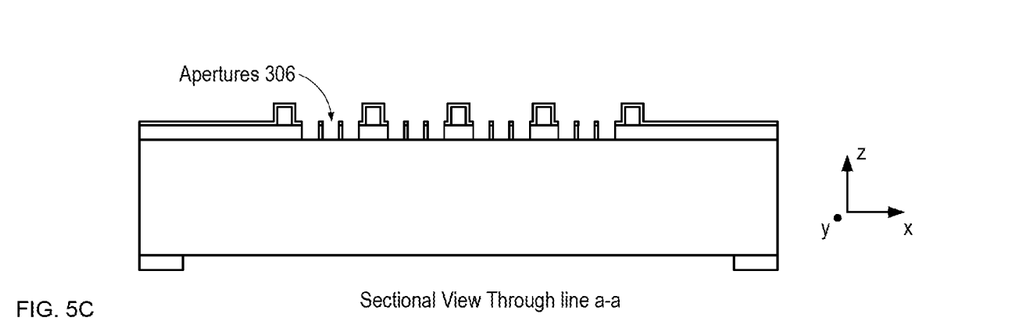

At operation 404, apertures 306 are formed by etching completely through structural layer 316.

FIG. 5C depicts a sectional view of nascent shadow mask 104 after the definition of apertures 306.

Figure 5D:
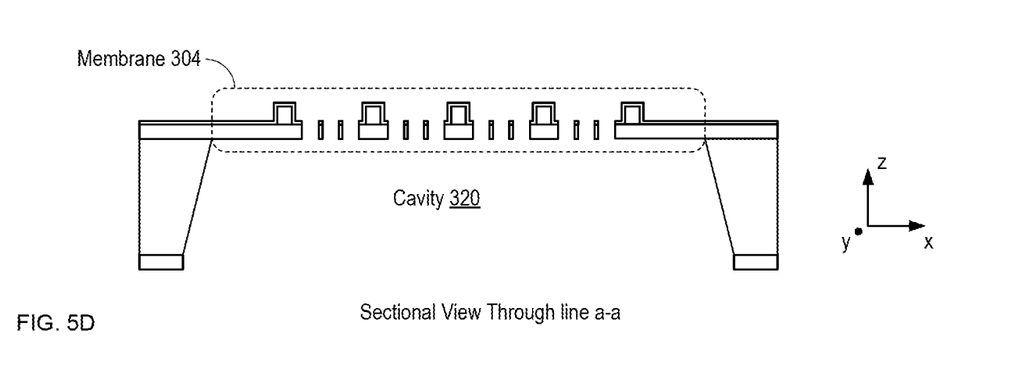

At operation 405, membrane 304 is defined by releasing a portion of structural layer 316 from handle substrate 502 by forming cavity 320.

Cavity 320 is formed by removing the material in the center of handle substrate 302 while leaving the outer portion of handle substrate 502 as annular frame 302. In the depicted example, cavity 320 is formed by removing the exposed silicon region via a crystallographic dependent etch (e.g., ethylene diamine pyrocatechol (EDP), potassium hydroxide (KOH), hydrazine, etc.). In some embodiments, cavity 320 is formed via deep reactive-ion etching, or other conventional process.

FIG. 5D depicts a sectional view of completed shadow mask 104 after the formation of cavity 320 and membrane 304.

Returning now to method 200, at operation 202, shadow mask 104 is mounted in mask chuck 102.

At operation 203, substrate 116 is mounted in substrate chuck 106.

At operation 204, alignment system 110 positions shadow mask 104 and substrate 116 such that apertures 306 are aligned with the desired deposition sites on the substrate surface (i.e., deposition sites 602). Typically, this alignment requires translation of one or both of the shadow mask and substrate in the x- and y-directions, as well as rotation of one or both of the shadow mask and substrate about vertical axis V1.

At operation 205, alignment system 110 moves shadow mask 104 and substrate 116 into a position in which standoffs 108 are in physical contact with the substrate (i.e., such that standoffs 108 and substrate 116 are in an abutting relationship).

Typically, alignment system controls the positions of mask chuck 102, substrate chuck 106, and source 112 such that shadow mask 104 and substrate 116 are aligned with each other, planes 116 and 118 are substantially parallel and orthogonal to vertical axis V1, and the shadow mask/substrate combination is substantially centered over source 112 along vertical axis V1. However, it will be appreciated by one skilled in the art that other arrangements of these components are within the scope of the present disclosure.

Figure 6:
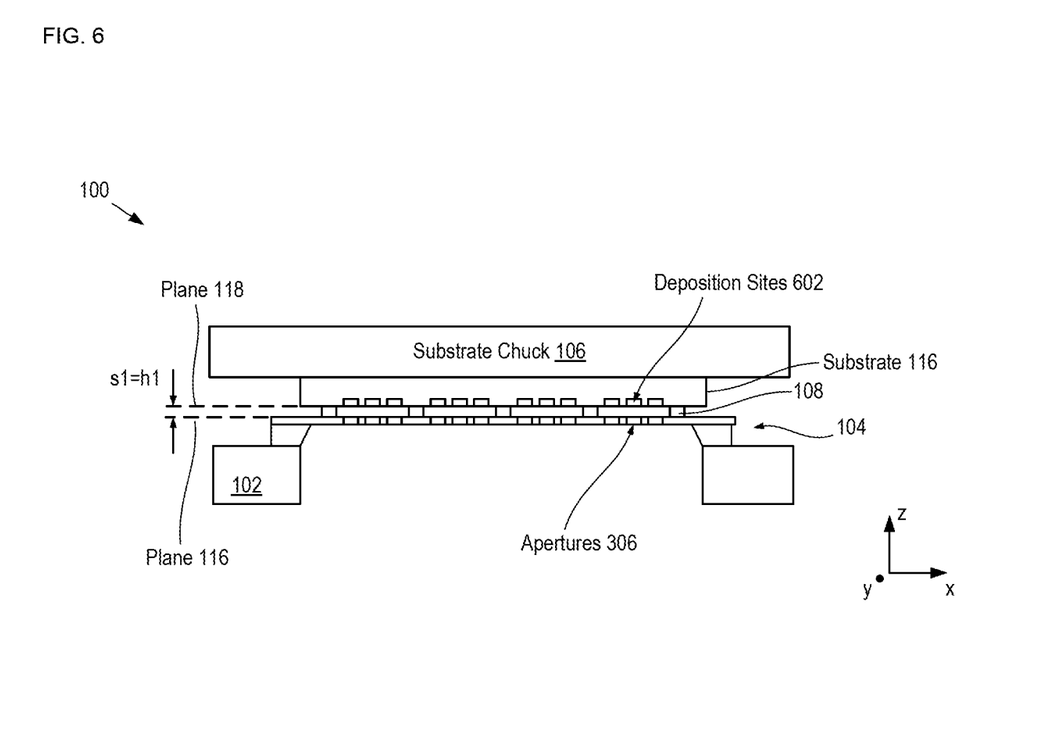
FIG. 6 depicts a cross-sectional view of system 100 with shadow mask 104 and substrate 116 positioned such that standoffs 108 are in an abutting relationship with the substrate.

In the depicted example, the desired separation, s1, is equal to the height, h1, of standoffs 108; therefore, by placing the standoffs and substrate in contact, separation s1 is made equal to h1.

FIG. 6 depicts a cross-sectional view of system 100 with shadow mask 104 and substrate 116 positioned such that standoffs 108 are in an abutting relationship with the substrate. It should be noted that the physical contact between standoffs 108 and substrate 116 is reversible.

In some embodiments, however, the desired separation, s1, is greater than h1 and standoffs 108 are used to set a reference point from which the desired separation can more easily be established. In such embodiments, method 200 includes optional operation 206 in which, after standoffs 108 and substrate 116 are put in physical contact, at least one of the shadow mask and substrate is moved along vertical axis V1 by an incremental amount to increase the separation between planes 116 and 118 to the desired separation s1. In other words, the abutting relationship between standoffs 108 and substrate 116 functions as a reference point from which the desired separation can be easily established.

At operation 207, source 112 vaporizes material 120 such that vaporized material passes through apertures 306 of shadow mask 104 to deposit on deposition sites 602.

As noted above, in some embodiments, standoffs 108 are located on one of mask chuck 102, substrate chuck 106, and substrate 116, rather than on shadow mask 104.

Figure 7A:
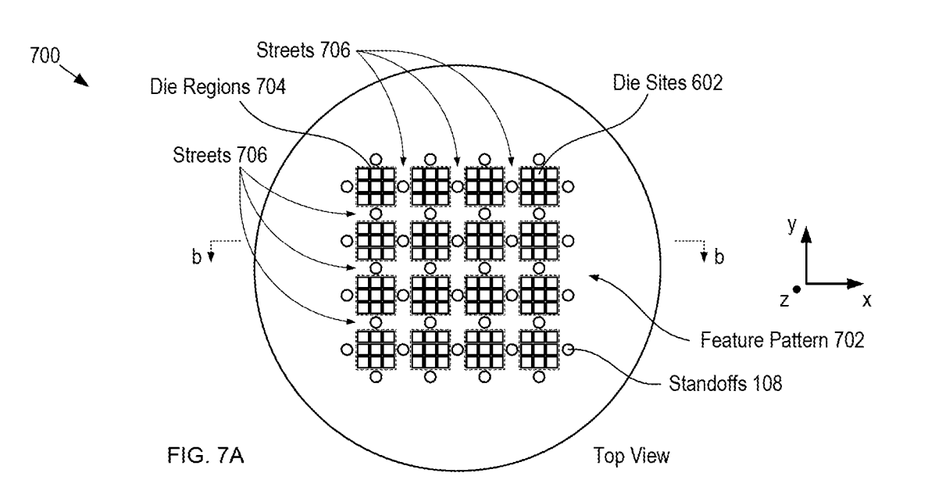
FIGS. 7A-B depict schematic drawings of top and sectional views, respectively, of an alternative system configuration in which standoffs 108 are affixed to substrate 116.
Figure 7B:
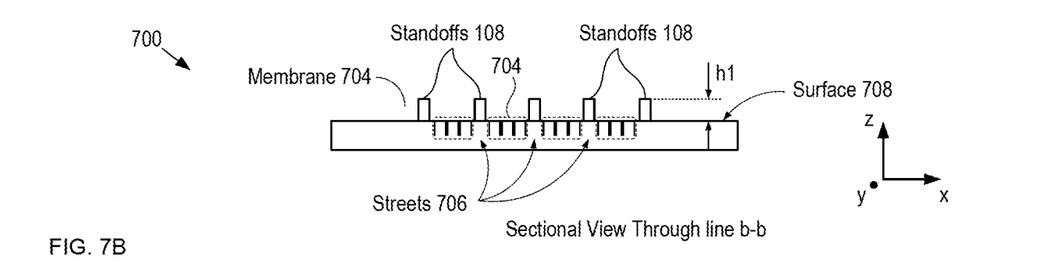

FIGS. 7A-B depict schematic drawings of top and sectional views, respectively, of an alternative system configuration in which standoffs 108 are affixed to substrate 116. The sectional view shown in FIG. 7B is taken through line b-b depicted in FIG. 7A.

Substrate 700 is analogous to substrate 116 and includes a plurality of deposition sites 602 that is arranged in feature pattern 702 on surface 708. Feature pattern 702 includes a 4×4 array of die regions 704, which are separated from one another by streets 706. Each die region 704 includes a 3×3 array of deposition sites 602, while each street 706 is deposition-site free. It should be noted that feature pattern 702 can include any number and arrangement of die regions 704, and each die region 704 can include any number and arrangement of deposition sites 602. In some embodiments, at least one of die regions 704 includes a different number and/or arrangement of deposition sites than at least one other die region 704.

Standoffs 108 are formed on surface 708 such that each of the standoffs is a substantially circular pillar having a height of approximately 10 microns and a diameter of approximately 20 microns. Standoffs 108 are distributed on surface 708 such that they reside outside feature pattern 702 and a standoff is located between each pair of adjacent die regions 704 in both the x- and y-directions. As will be appreciated by one skilled in the art, after reading this Specification, the locations and arrangements of standoffs 108 are matters of design choice and depend on several factors, such as the size of die regions 704, the desired separation, s1, between shadow mask 104 and substrate 116, and the like. For example, in some embodiments, standoffs 108 are located only outside of the lateral extent of feature pattern 702, while in other embodiments, standoffs 108 are located only within the lateral extent of feature pattern 702.

Figure 8A:
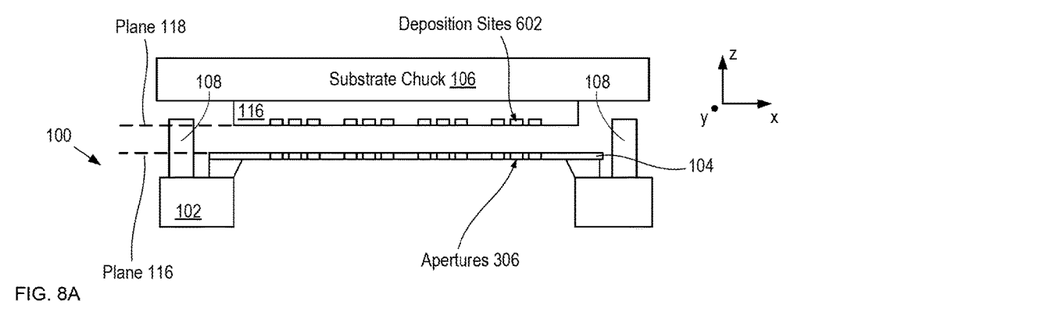
FIG. 8A depicts an alternative system configuration in which standoffs 108 are affixed to mask chuck 102.

FIG. 8A depicts an alternative system configuration in which standoffs 108 are affixed to mask chuck 102. For clarity, system 800 is depicted while standoffs 108 are not in physical contact with substrate chuck 106.

Figure 8B:
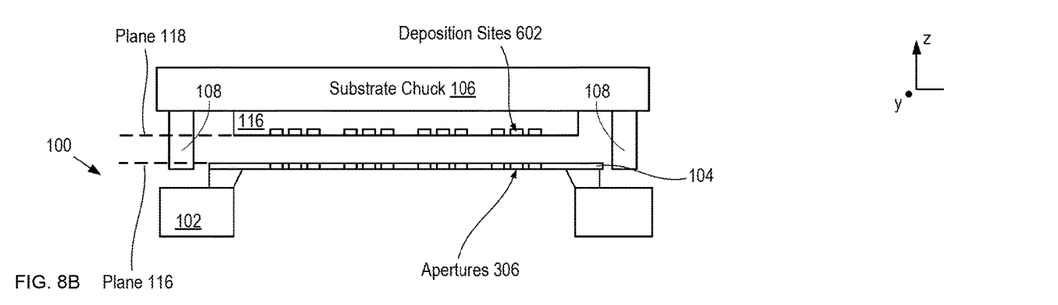
FIG. 8B depicts an alternative system configuration in which standoffs 108 are affixed to substrate chuck 106.

FIG. 8B depicts an alternative system configuration in which standoffs 108 are affixed to substrate chuck 106. For clarity, system 802 is depicted while standoffs 108 are not in physical contact with mask chuck 102.

It should be noted that, although that standoffs of systems 800 and 802 reside outside the outer diameter of shadow mask 104, in some embodiments, a shadow mask includes etched features through which one or more standoffs can project, thereby enabling the standoffs to be affixed to either or both of mask chuck 102 and substrate chuck 106 within the perimeter of the shadow mask.

Figure 9A:
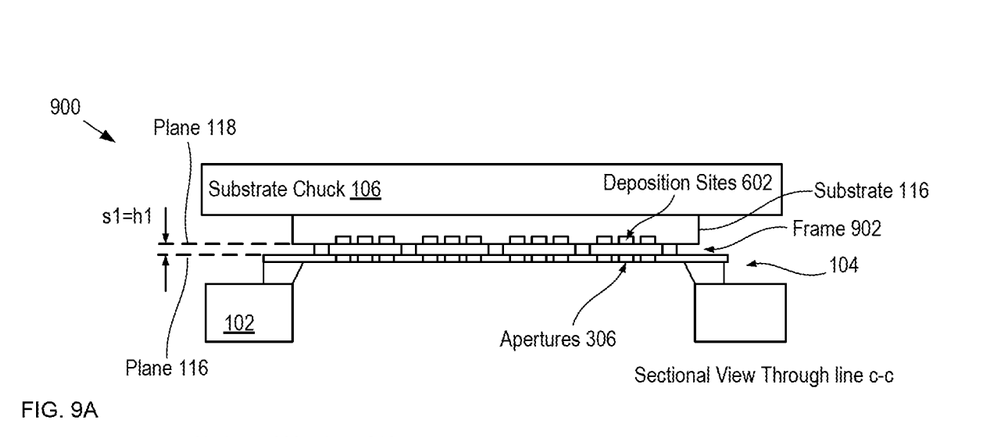
FIG. 9A depicts a sectional view of a system in which standoffs 108 are unaffixed with each of mask chuck 102, substrate chuck 106, and substrate 116.

FIG. 9A depicts a sectional view of a system in which standoffs 108 are unaffixed with each of mask chuck 102, substrate chuck 106, and substrate 116. System 900 includes mask chuck 102, shadow mask 104, substrate chuck 106, alignment system 110 (not shown), and frame 902.

Figure 9B:
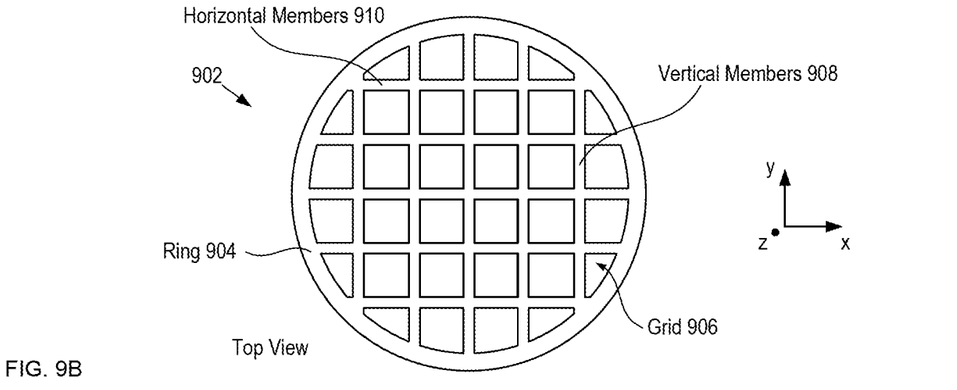
FIG. 9B depicts a top view of frame 902.

FIG. 9B depicts a top view of frame 902.

Frame 902 is an annular element that includes ring 904 and grid 906, each of which has a thickness of h1, as discussed above.

Ring 904 is an annulus having an interior opening that is larger than the lateral extent of each of aperture pattern 310 and feature pattern 702.

Grid 906 includes vertical members 908 and horizontal members 910, each of which is aligned with a different one of lanes 314 and streets 706. As a result, vertical members 908 and horizontal members 910 reside between adjacent fields 312 and adjacent die regions 704. As a result, when frame 902 resides between the shadow mask and substrate, neither ring 902 nor grid 904 interferes with the flow of vaporized material 120 through apertures 306 onto deposition sites 602.

In the depicted example, frame 902 is configured to be inserted between shadow mask 104 and substrate 116; however in some embodiments, frame 902 is configured to be inserted between substrate chuck 106 and mask chuck 102.

In some embodiments, frame 902 includes only ring 904. In some embodiments, grid 906 includes fewer lateral members than the number of lanes in shadow mask 104 or streets on substrate 116.

It is to be understood that the disclosure teaches just some embodiments in accordance with the present invention and that many variations of the invention can easily be devised by those skilled in the art after reading this disclosure and that the scope of the present invention is to be determined by the following claims.

What is claimed is:

1. A direct-deposition system for forming a patterned layer of a first material on a substrate by depositing the first material onto the substrate through a shadow mask, wherein the system comprises:
 a first chuck for holding the substrate;
 a second chuck for holding the shadow mask;

a first plurality of standoffs, each standoff of the first plurality thereof having a first height that establishes a first separation between the shadow mask and the substrate when the shadow mask and substrate are in contact; and the shadow mask, wherein the shadow mask includes a first plurality of apertures that is arranged in an aperture pattern that includes:
  (i) an array of fields, each field being standoff-free and including a two-dimensional array of apertures of the first plurality thereof; and
  (ii) a plurality of lanes, each lane being aperture free;
  wherein the plurality of lanes is arranged in a two-dimensional arrangement such that (1) each pair of adjacent fields of the plurality thereof is separated by a different lane of the plurality thereof and (2) each lane resides between two fields of the array thereof;
wherein the plurality of first standoffs is arranged in a two-dimensional arrangement such that at least one standoff of the first plurality thereof is affixed to the shadow mask within each lane of the plurality thereof; and
wherein each standoff of the first plurality thereof is located only on the shadow mask and is capable of being removed from contact with the substrate.

2. The system of claim 1 wherein the first material is an organic material.

3. The system of claim 2 wherein the first material is an organic material operative for emitting light.

4. The system of claim 1 further comprising a second plurality of standoffs, wherein at least one standoff of the second plurality thereof is affixed to the shadow mask at a location outside the aperture pattern.

5. The system of claim 1 further comprising an alignment system that is configured to establish the first separation by placing the first plurality of standoffs in an abutting relationship with at least one of the substrate, the first chuck, and the second chuck.

6. The system of claim 5, wherein the alignment system is further configured to establish a second separation between the shadow mask and substrate that is different than the first separation by inducing a relative motion between the shadow mask and substrate after the first separation has been established.

7. The system of claim 1 wherein the first plurality of standoffs is in direct contact with the substrate when the shadow mask and substrate are in contact.

8. The system of claim 1 wherein the substrate is standoff-free.

9. The system of claim 1 wherein each of the first plurality of standoffs is located in a lane of the plurality thereof, and wherein each lane is larger in a first spacing between adjacent apertures within each field of the plurality thereof.

10. A direct-deposition system for forming a patterned layer of a first material on a substrate by depositing the first material onto the substrate through a shadow mask, wherein the system comprises:
a first chuck for holding the substrate;
a second chuck for holding the shadow mask;
the shadow mask, wherein the shadow mask includes (1) a first plurality of standoffs, each standoff of the plurality thereof having a first height that establishes a first separation between the shadow mask and the substrate when the shadow mask and substrate are in contact and (2) a first plurality of apertures that is arranged in an aperture pattern that includes:
  (i) an array of fields, each field being standoff-free and including a two-dimensional array of apertures of the first plurality thereof; and
  (ii) a plurality of lanes, each lane being aperture free;
  wherein the plurality of lanes is arranged in a two-dimensional arrangement such that (1) each pair of adjacent fields of the plurality thereof is separated by a different lane of the plurality thereof and (2) each lane resides between two fields of the array thereof; and
  wherein the plurality of standoffs is arranged in a two-dimensional arrangement such that at least one standoff of the first plurality thereof is affixed to the shadow mask within each lane of the plurality thereof; and
an alignment system configured to establish a second separation between the shadow mask and substrate, the second separation being based on the first separation;
wherein each standoff of the first plurality thereof is located only on the shadow mask and is movable relative to the substrate.

11. The system of claim 10 wherein the second separation is equal to the first separation, and wherein the alignment system is configured to establish the first separation by placing the first plurality of standoffs in an abutting relationship with at least one of the first chuck, second chuck, and substrate.

12. The system of claim 10 wherein the second separation is greater than the first separation, and wherein the alignment system is configured to (1) establish the first separation by placing the first plurality of standoffs in an abutting relationship with at least one of the first chuck, second chuck, and substrate, and (2) establish the second separation by inducing a relative motion between the shadow mask and substrate after the first separation has been established.

13. The system of claim 10 further comprising a second plurality of standoffs, wherein at least one standoff of the second plurality thereof is affixed to the shadow mask at a location outside the aperture pattern.

14. The system of claim 10 wherein each of the first plurality of standoffs is in direct contact with the substrate when the shadow mask and substrate are in contact.

15. The system of claim 10 wherein the substrate is standoff-free.

16. The system of claim 10 wherein each of the first plurality of standoffs is located in a lane of the plurality thereof, and wherein each lane is larger in a first spacing between adjacent apertures within each field of the plurality thereof.

* * * * *